United States Patent [19]
Priou et al.

[11] Patent Number: 5,703,137
[45] Date of Patent: Dec. 30, 1997

[54] INITIATORS FOR THE CATIONIC CROSSLINKING OF POLYMERS CONTAINING ORGANOFUNCTIONAL GROUPS

[75] Inventors: Christian Priou, Villeurbanne, France; Stuart Kerr, III, Rock Hill, S.C.

[73] Assignee: Rhone-Poulenc Chimie, Courbevoie Cedex, France

[21] Appl. No.: 616,170

[22] Filed: Mar. 14, 1996

[51] Int. Cl.$^6$ .............................. C08L 83/06; C08F 2/50
[52] U.S. Cl. .................. 522/25; 522/26; 522/31; 522/53; 522/99; 522/148; 522/170; 522/181; 528/13; 528/20; 528/23; 528/32; 528/40; 528/403; 528/421
[58] Field of Search .................... 522/25, 26, 31, 522/53, 99, 148, 170, 187; 528/13, 20, 23, 32, 40, 403, 421

[56] References Cited

U.S. PATENT DOCUMENTS

| | | | |
|---|---|---|---|
| 5,200,437 | 4/1993 | Dougherty et al. | 522/181 |
| 5,340,898 | 8/1994 | Cavezzan et al. | 528/19 |
| 5,461,099 | 10/1995 | Ishikawa et al. | 524/317 |
| 5,468,902 | 11/1995 | Castellananos et al. | 568/6 |
| 5,556,734 | 9/1996 | Yamachika et al. | 430/270.1 |

FOREIGN PATENT DOCUMENTS

WO 90/11303  10/1990  WIPO .............. C08F 4/00

Primary Examiner—Susan W. Berman
Attorney, Agent, or Firm—Andrew M. Solomon

[57] ABSTRACT

The present invention relates to initiators for the polymerization and/or crosslinking, cationically and under photochemical and/or thermal activation and/or activation by a beam of electrons, of monomers and/or polymers containing organofunctional groups.

The said initiators are of the type comprising an onium salt of an element from groups 15 to 17 of the Periodic Table (Chem & Eng News, Vol 63, N5, 26, of 4 Feb. 1985) and they are characterized in that they contain at least one polymerization and/or crosslinking accelerator chosen from α-hydroxylated carboxylic acid esters such as, for example, lactic acid esters. Another subject of the invention is compositions based on at least one cationically crosslinkable polyorganosiloxane and on at least one initiator.

16 Claims, 2 Drawing Sheets

INITIATORS FOR THE CATIONIC CROSSLINKING OF POLYMERS CONTAINING ORGANOFUNCTIONAL GROUPS

FIELD OF THE INVENTION

The field of the invention is that of the catalysis of cationic crosslinking and/or polymerization reactions, of monomers and/or polymers, e.g. those containing silicon, comprising reactive functional radicals capable of forming intra- and intercatenary bridges, so as to obtain a polymerized and/or crosslinked material having a certain hardness and certain mechanical strength.

More precisely, the subject of the present invention is cationic crosslinking and/or polymerization initiators. Although these initiators are not catalysts strictly speaking, they may nevertheless be likened to catalytic compounds which allow the initiation and progress of the reaction for the formation of polymers and/or reticulates, from substrates formed of monomers and/or polymers containing reactive organofunctional groups.

The reactions more particularly concerned are those in which cationic agents act as direct promoters of the inter- and intracatenary bonds.

Traditionally, these reactions can only take place under photochemical and/or thermal activation and/or activation by a beam of electrons. In practice, it is, for example, the light energy of ultraviolet (UV) radiation which allows the formation of the active protagonists, for example by radical cleavage, and thus the triggering and continuation of the crosslinking and/or polymerization.

Without this being limiting, the present account relates more particularly to polymerized or crosslinked substrates of polyorganosiloxane type containing reactive organofunctional groups, for example of the epoxide and/or vinyl ether type. These functional polyorganosiloxanes which are cationically crosslinkable using the initiators targeted above may be used in particular for the production of antiadhesive coatings on solid supports or articles (e.g. paper or polymer film of the polyester or polyethylene type).

The subject of the present invention is thus compositions based on crosslinkable functional polyorganosiloxanes and the above-targeted initiators.

The invention also relates to the application of these compositions as coatings for solid supports or articles, the latter themselves constituting another subject of the invention.

Cationic initiators for the polymerization or crosslinking, e.g. via a photochemical route, of functional monomers or polymers of the polyorganosiloxane type in particular are described in European patent application EP-A-0,562,897 in the name of the Applicant. These photoinitiators consist of onium borates of an element from groups 15 to 17 of the Periodic Table (Chem & Eng News, Vol 63, N5, 26 of 4 Feb. 1985) or of an organometallic complex of an element from groups 4 to 10 of the Periodic Table (Chem & Eng News, Vol 63, 'N5, 26 of 4 Feb. 1985), the borate anion species of which has the formula:

in which formula:
a and b are integers ranging from 0 to 4 with a+b=4,
the symbols X represent:
a halogen atom (chlorine or fluorine) with a=0 to 3,
an OH function with a=0 to 2,
the symbols R are identical or different and represent:
an aryl radical substituted with at least one electron-withdrawing group or with at least 2 halogen atoms, when the cationic species is an onium,
an aryl radical substituted with at least one halogen atom or an electron-withdrawing group, when the cationic species is an organometallic complex.

These novel self-initiating salts represent appreciable technical progress relative to the known initiators of onium salt or organometallic complex type, and in particular relative to those in which the anion of the initiator salt is $SbF_6^-$, which is one of the only ones which give good catalytic performance, but which poses serious problems of use on account of its toxicity.

The photoinitiator salts according to EP-A-0,562,897 are employed in combination with an alcohol, such as methanol, in order to produce antiadhesive coatings on paper, from epoxidized monomers, crosslinked by irradiation under UV. In order to assess the performance of the photoinitiator, the reactivity of the substrate/initiator couple and the rate of crosslinking are evaluated by means of the throughput speed necessary to cure the layer coated on the paper and by means of the number of passages.

The compositions based on polyorganosiloxanes which are crosslinkable with the aid of onium borates according to EP-A-0,562,897 are described and claimed in European patent application EP-A-0,562,922, also in the name of the Applicant. According to the latter document, the photoinitiator systems used contain onium or oxoisothiochromanium borate and an alcoholic solvent. The quality of the coatings obtained reflects the performance of these photoinitiator systems. Moreover, in order to assess this quality of coating, the antiadhesive properties of the layer of crosslinked silicone polymer attached to the support is evaluated. The results measured are acceptable, but it nevertheless remains that, in order to satisfy the productivity requirements of the users, the initiator systems need to be of increasingly high performance. They must thus achieve reactivities and crosslinking/polymerization rates which are as high as possible, so as to be able to increase the frequency of coating.

Given this situation, one of the essential aims of the present invention is to satisfy the abovesaid requirements.

Another essential aim of the invention is to provide initiators which give good performance with the majority of monomers/polymers, in particular including functional polyorganosiloxanes, which are crosslinkable cationically and under UV, but also purely organic, epoxidized or vinylic monomers.

Another essential aim of the invention is to provide cationic initiators which are effective but also inexpensive, easy to handle and of low toxicity.

Another aim of the invention is to provide organofunctional monomer/polymer compositions, in particular organofunctional polyorganosiloxanes, which are crosslinkable cationically and under photonic and/or thermal activation and/or activation by a beam of electrons.

Another aim of the invention is to provide a process for coating solid supports or articles using the abovesaid compositions, as well as the articles with a crosslinked antiadhesive coating obtained.

SUMMARY OF THE INVENTION

These aims and others are achieved by the invention, which relates, firstly, to initiators for the cationic crosslinking and/or polymerization, under photochemical and/or thermal activation and/or activation by a beam of electrons, of monomers and/or polymers containing organofunctional groups, the said initiators being of the type comprising a catalytically effective amount of at least one onium salt of an element from groups 15 to 17 of the Periodic Table (Chem & Eng News, Vol 63, N5, 26 of 4 Feb. 1985) and/or of at least one oxoisothiochromanium salt according to application WO-A-90/11303, characterized in that they contain at least one polymerization and/or crosslinking accelerator chosen from the hydroxylated carboxylic acid esters, which are liquid at room temperature (23° C.), of general formula:

(I)

in which the symbols $R^1$ and $R^2$, which are identical to or different from each other, each represent:

- a linear or branched $C_1$–$C_{10}$ alkyl radical, optionally substituted with a linear or branched $C_1$–$C_4$ alkoxy group,
- a $C_4$–$C_{10}$ cycloalkyl radical, optionally substituted with one or more linear or branched $C_1$–$C_4$ alkyl or alkoxy group(s),
- a $C_5$–$C_{12}$ aryl radical, optionally substituted with one or more linear or branched $C_1$–$C_4$ alkyl or alkoxy group(s),
- an aralkyl or aroxyalkyl radical in which the aryl part is a $C_5$–$C_{12}$ group optionally substituted with one or more linear or branched $C_1$–$C_4$ alkyl or alkoxy groups, and the alkyl part is a linear or branched $C_1$–$C_4$ group, it being also possible for the symbol $R^1$ to represent:

- a linear or branched $C_1$–$C_{15}$ alkoxy radical,
- a $C_4$–$C_{10}$ cycloalkyloxy radical, optionally substituted with one or more linear or branched $C_1$–$C_4$ alkyl or alkoxy group(s).

These accelerators make it possible to improve significantly the performance of the cationic initiators in terms of reactivity and kinetics, as well as the final properties of the crosslinked coatings obtained. Moreover, the Applicant has, to its credit, been able to isolate a family of specific organic compounds which are particularly suitable as accelerator.

The accelerator is preferably formed by at least one hydroxylated carboxylic acid ester of general formula (I) in which:

$R^1$ represents: a linear $C_1$–$C_3$ alkyl radical, and
$R^2$, which is identical to or different from $R^1$, represents: a linear or branched $C_2$–$C_6$ alkyl radical.

The accelerator is more preferably formed by at least one lactic acid ester of general formula (I) in which $R^1$ represents a methyl radical and $R^2$ represents a linear $C_3$–$C_5$ alkyl radical.

In practice, the weight proportions between the initiator salt or salts, in particular the onium borates, on the one hand, and the accelerator, on the other hand, expressed as parts by weight, are respectively between 0.1:100 and 1:0.5, preferably between 2:100 and 1:1, and more preferably between 4:100 and 1:1. When the accelerator is chosen from the sub-family of lactic acid esters, the weight proportions which are most especially suitable are between 15:100 and 40:100.

DESCRIPTION OF THE PREFERRED EMBODIMENT

Figure 1:
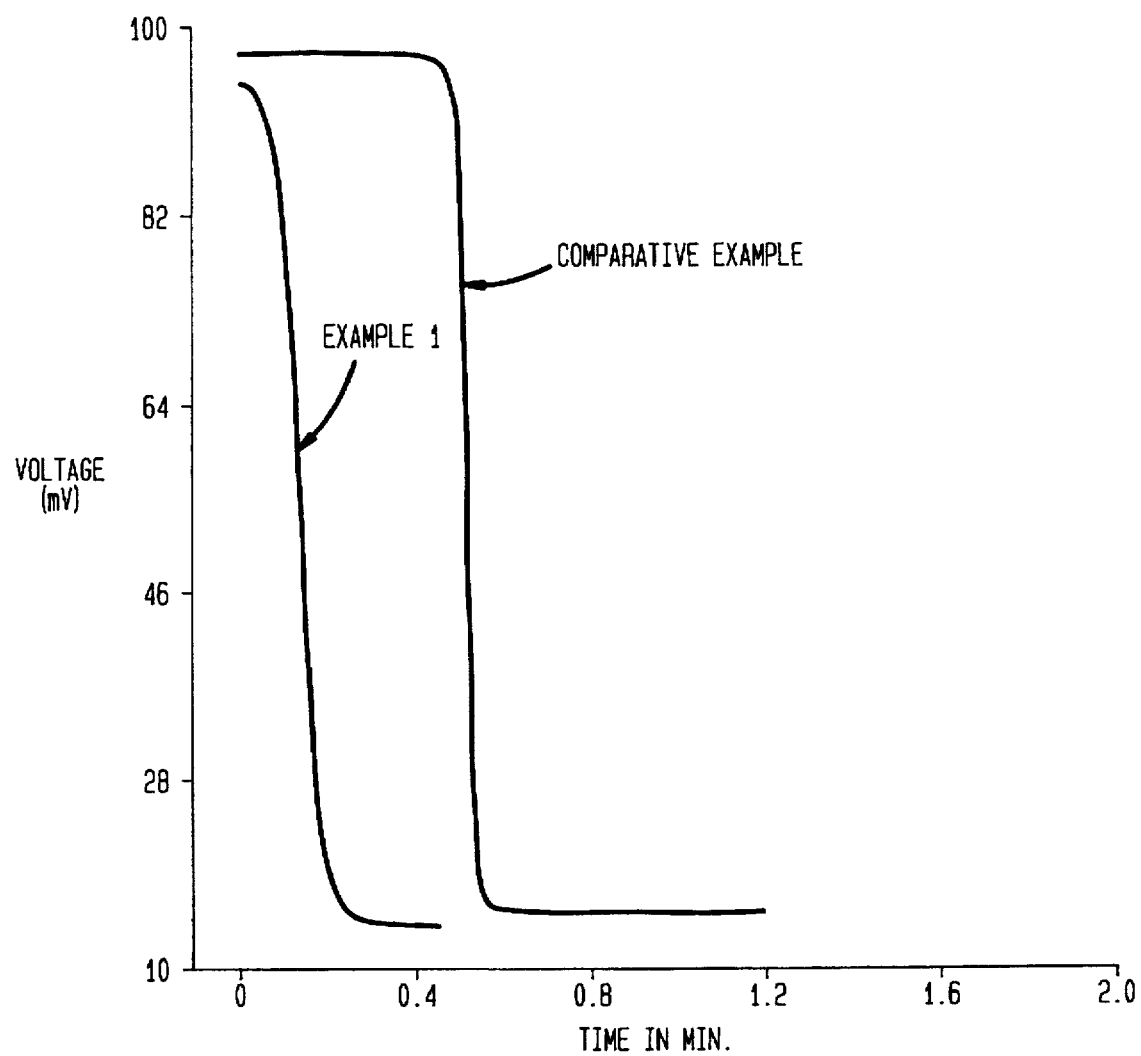
FIGS. 1 and 2 are graphical results of the Examples of the disclosed invention.

In accordance with an advantageous arrangement of the invention, the initiators comprise a catalytically effective amount of an onium borate the cationic species of which is chosen from:
1) the onium salts of formula (II)

(II)

in which formula:

A represents an element from groups 15 to 17 such as, for example, I, S, Se, P and N, $R^3$ represents a $C_6$–$C_{20}$ carbocyclic or heterocyclic aryl radical, preferably phenyl, tolyl or toluyl, it being possible for the said heterocyclic radical to contain, for example, nitrogen or sulphur as hetero elements, $R^4$ represents $R^3$ or a linear or branched $C_1$–$C_{30}$ alkyl or alkenyl radical, the said radicals $R^3$ and $R^4$ optionally being substituted, in particular with a $C_1$–$C_{25}$ alkoxy, $C_1$–$C_{25}$ alkyl, nitro, chloro, bromo, cyano, carboxyl or mercapto group, n is an integer ranging from 1 to v+1, v being the valency of the element A, m is an integer ranging from 0 to v−1 with n+m=v+1, 2) the oxoisothiochromanium salts described in patent application WO-A-90/11303, the anionic borate species of which has the formula (III):

$$[BX_aR_b]$$ (III)

in which formula:

a and b are integers ranging from 0 to 4 with a+b=4, the symbols X represent:
- a halogen atom (chlorine or fluorine) with a=0 to 3,
- an OH function with a=0 to 2, the symbols R are identical or different and represent:
- a phenyl radical substituted with at least one electron-withdrawing group such as, for example, $OCF_3$, $CF_3$, $NO_2$ or CN or with at least 2 halogen atoms (most particularly fluorine),
- an aryl radical containing at least two aromatic rings such as, for example, biphenyl or naphthyl, optionally substituted with at least one element or an electron-withdrawing group, in particular a halogen atom (most particularly fluorine), $CF_3$, $OCF_3$, $NO_2$ or CN.

Advantageously, the anionic borate species is chosen from the following anions:

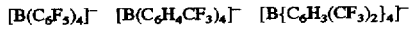
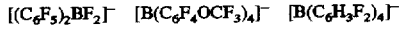

As regards the cationic species, it is advantageously of onium type and is preferably selected from the following cations:

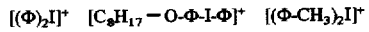
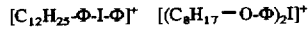
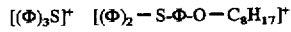
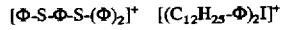

In accordance with the invention, the initiators which will be used more particularly are the following onium borates:

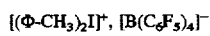

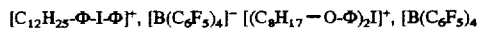

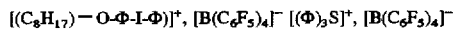

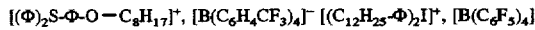

The onium borates entering into the formulation of the initiator system according to the invention are defined in detail in the abovementioned European patent applications EP-A-0,562,897 and EP-A-0,562,992. The content of these patents is incorporated into the present account by way of reference.

The cationic species of oxoisothiochromanium type, entering into the formulation of the initiator system according to the invention, preferably corresponds to the structure D1 which is defined on page 14 of application WO-A-90/11303 and has the formula:

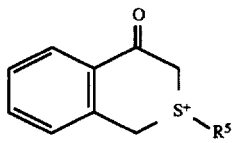

in which the radical $R^5$ is a substituted or unsubstituted alkyl radical; a cationic species of this type which is more preferred is that in which $R^5$ represents a linear or branched $C_1$–$C_{20}$ alkyl radical. As oxoisothiochromanium salts which are particularly suitable, mention will be made in particular of the sulphonium salt of 2-ethyl-4-oxoisothiochromanium or of 2-dodecyl-4-oxoisothiochromanium.

In practice, the initiators according to the invention are very simply prepared by dissolving the onium borate, which is in solid (powder) form, in the accelerator (liquid).

According to an alternative with regard to the onium borate, the latter may be prepared directly in the accelerator, from a salt (e.g. chloride) of the cation (iodonium) and a salt (for example the potassium salt) of the borate anion.

The precursor system thus obtained may be used as it is in monomer/polymer compositions which are intended to be polymerized/crosslinked cationically and under activation, for example UV activation.

According to another of these aspects, the present invention relates to compositions based on at least one cationically crosslinkable polyorganosiloxane and on at least one initiator of the type in accordance with the invention and described above.

Preferably, this polyorganosiloxane has organofunctional groups of the epoxide and/or vinyl ether type and it is chosen from polyorganosiloxanes which are:

linear or substantially linear and consisting of units of formula (IV), ending with units of formula (V), or cyclic and consisting of units of formula (IV):

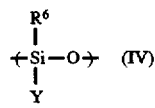   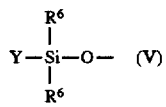

in which formulae:

the symbols $R^6$ are identical or different and represent: either a linear or branched $C_1$–$C_6$ alkyl radical, optionally substituted, advantageously with one or more halogens, the preferred optionally substituted alkyl radicals being: methyl, ethyl, propyl, octyl and 3,3,3-trifluoropropyl, or an optionally substituted $C_5$–$C_8$ cycloalkyl radical, or a $C_5$–$C_{12}$ aryl radical or aralkyl radical having a $C_5$–$C_{12}$ aryl part and a $C_1$–$C_4$ alkyl part, optionally substituted on the aromatic part:

in particular with halogens or $C_1$–$C_3$ alkyls and/or alkoxys phenyl, xylyl, tolyl and dichlorophenyl radicals being most particularly selected, and, even more preferably, at least 60 mol % of the radicals $R^6$ being methyls, the symbols Y are identical or different and represent: either the radical $R^6$, or a cationically crosslinkable organofunctional group, preferably an epoxyfunctional or vinyloxyfunctional group, connected to the silicon by a divalent radical advantageously containing from 2 to 20 carbon atoms optionally containing a hetero atom, at least one of the symbols Y corresponding to a cationically crosslinkable organofunctional group.

According to a preferred mode of the invention, the polyorganosiloxane contains from 1 to 10 organofunctional groups per mole. For an epoxyfunctional group, this corresponds to epoxide levels ranging from 20 to 200 molar meq/100 g of product.

As examples of divalent radicals connecting an organofunctional group of the epoxy type, mention may be made of those included in the following formulae (Y):

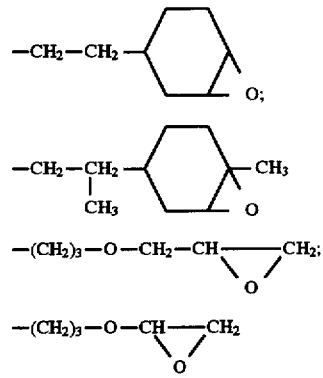

As regards organofunctional groups of vinyl ether type, mention may be made, for example, of those contained in the following formulae (Y):

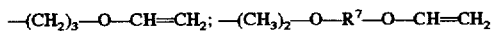

with $R^7=$ linear or branched $C_1$–$C_{12}$ alkylene, optionally substituted or $C_5$–$C_{12}$ arylene, preferably phenylene, optionally substituted, preferably with one to three $C_1$–$C_6$ alkyl groups.

The linear polyorganosiloxanes may be oils with a dynamic viscosity of about 10 to 10,000 mPa s at 25° C., generally of about 50 to 5000 mPa s at 25° C. and, even more preferably, of 100 to 600 mPa s at 25° C., or gums having a molecular mass of about 1,000,000.

The dynamic viscosity at 25° C. of all of the silicone polymers considered in the present account may be measured using a Brookfield viscometer, according to AFNOR standard NFT 76 102 of February 1972.

The viscosity considered in the present account is the dynamic viscosity at 25° C., referred to as the "Newtonian" viscosity, that is to say the dynamic viscosity which is measured, in a manner which is known per se, at a shear rate gradient which is sufficiently low for the viscosity measured to be independent of the rate gradient.

When these are cyclic polyorganosiloxanes, they constitute units (IV) which may be, for example, of the dialkylsiloxy or alkylarylsiloxy type. These cyclic polyorganosiloxanes have a viscosity of about 1 to 5000 mPa s. With the availability of this large variety of polyorganosiloxanes, it is entirely conceivable to use a mixture of various products of formulae (IV) and (V), as defined above, within the context of the invention.

The preferred epoxyfunctional or vinyloxyfunctional polyorganosiloxanes are described in particular in patents DE-A-4,009,889; EP-A-0,396,130; EP-A-0,355,381; EP-A-0,105,341; FR-A-2,110,115; FR-A-2,526,800.

The epoxyfunctional polyorganosiloxanes may be prepared by hydrosilylation reaction between oils containing Si—H units and epoxyfunctional compounds such as, for example, 4-vinylcyclohexene oxide or allyl glycidyl ether.

The vinyloxyfunctional polyorganosiloxanes may be prepared by hydrosilylation reaction between oils containing Si—H units and vinyloxyfunctional compounds such as, for example, allyl vinyl ether or allylvinyloxyethoxybenzene.

The polyorganosiloxanes given above by way of example are particularly advantageous insofar as the accelerators in accordance with the invention proved to be fully soluble in these polyorganosiloxanes.

According to the invention, the expression catalytically effective amount of onium borate refers to an amount which is sufficient to initiate the crosslinking. This amount is generally between 0.01 and 20 parts by weight, usually between 0.1 and 8 parts by weight, in order to crosslink, photochemically, 100 parts by weight of polyorganosiloxanes.

The compositions according to the invention may also comprise at least one photosensitizer selected from (poly) aromatic (optionally metallic) and heterocyclic products and, preferably, from the following list of products: toluene, pyridine, ferrocene, benzene, thioxanthone, anthracene, benzophenone.

Conventionally, the compositions according to the invention may also comprise various additives which are chosen as a function of the final application intended. These may be, for example, mineral or non-mineral fillers and/or pigments, such as synthetic or natural (polymer) fibres which are ground, calcium carbonate, talc, clay, titanium dioxide or fumed silica. This may make it possible to improve e.g. the mechanical properties of the final materials.

Soluble dyes, oxidation inhibitors, and/or any other material which does not interfere with the catalytic activity of the photoinitiator and which does not absorb in the wavelength range chosen for the photoactivation may also be added to the composition or used in the context of the process according to the invention.

Lastly, the compositions according to the invention may contain other ingredients such as, in particular, adhesion modifiers (for example: linear silicone resins or polymers bearing vinyl, epoxy, vinyl ether or alcohol functions), fungicides, bactericides and antimicrobial agents, or corrosion inhibitors.

These compositions in accordance with the invention are prepared, indiscriminately, before (or even a long time before) or alternatively immediately before use.

It should be noted that these compositions are particularly stable on storage and that they offer, in accordance with the process of the invention, rapid crosslinking kinetics. In addition, their non-crosslinked state, before exposure to the activating light radiation, offers great ease of handling, of application and of placement on various supports or other shaping moulds.

The compositions according to the invention may be used as they are. They are useful in particular: in the field of antiadhesion coatings on solid supports of any of any nature, such as cellulose materials, plastics, metals, ceramics, films or paints; or in the field of the encapsulation of electrical and electronic components; or in the field of textile coatings; or in the field of optical fibre sheaths.

They are most particularly advantageous when they are used as they are in order to render a material, such as metal sheets, glass, plastics or paper, non-adhesive to other materials to which it would normally adhere. The composition advantageously has a viscosity not exceeding 5000 mPa s, preferably not exceeding 4000 mPa s, at 25° C.

The invention is thus also directed towards a process which makes it possible to render articles (for example sheets) non-adhesive to surfaces to which they normally adhere, which process is characterized in that it consists in applying an amount of composition of the invention, generally of between 0.1 and 500 g per $m^2$ of surface to be coated, and in crosslinking the composition by supplying it with energy, at least some and preferably all of which is provided by UV radiation.

The UV radiation used has a wavelength of between 200 and 400 nanometer, preferably of between 254 and 360 nanometer.

The irradiation time may be short and it is generally less than 1 second and it is about a few hundredths of a second for coatings of very small thickness. The crosslinking carried out is excellent, even in the absence of any heating. Obviously, the coupling of photoactivation with thermal activation, e.g. by heating to between 25° and 100° C., is not excluded from the invention.

Obviously, the curing time may be adjusted, in particular by the number of UV lamps used, by the duration of exposure to the UV and by the distance between the composition and the UV lamp.

The amounts of compositions deposited on the supports are variable and usually range between 0.1 and 500 $g/m^2$ of surface treated. These amounts depend on the nature of the supports and on the desired antiadhesive properties. They are usually between 0.5 and 3 $g/m^2$ for non-porous supports. These amounts may range up to 200 $g/m^2$ in the case of organic resins.

Another subject of the present invention is articles (for example sheets) consisting of a solid material (for example: metal, glass, plastic or paper) at least partly coated with the composition described above, which is at least partly crosslinked.

The examples which follow are given by way of illustration and should not be considered as a limit of the field or spirit of the invention.

EXAMPLES

I—Starting materials

I.1. The functionalized polyorganosiloxanes used are (1,2-epoxy-4-ethylcyclohexyl)polydimethylsiloxanes of formula:

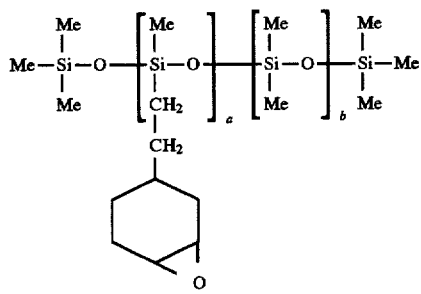

Epoxidized PDMS

The values of a and b vary according to the examples.

I.2. The initiator used is an onium borate: ditolyliodonium tetrakis(pentafluorophenyl)borate of formula

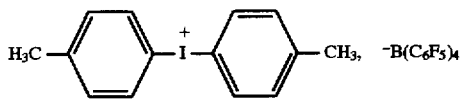

The cation of this onium borate is prepared according to the general methodology described in European patent applications EP-A-0,562,922 and EP-A-0,562,897. As regards the anionic borate species, the process is performed as follows:

Bromopentafluorobenzene (21.3 g, 0.086 mol) and isopropyl ether are loaded, under an inert atmosphere, into a 500 ml round-bottomed flask equipped with a mechanical stirrer, a condenser and a dropping funnel. The mixture is stirred and is cooled to a temperature of −78° C. using an acetone+cardice bath.

n-Butyllithium in solution in hexane (1.6M, 52.3 ml, 0.97 eq) is loaded into the dropping funnel and is then added over about 10 minutes. The mixture is then left stirring for about 30 minutes at a temperature of −78° C. The dropping funnel is replaced by a dropping funnel containing boron trichloride in solution in hexane (1.0M, 19 ml). The boron trichloride is added over 15 min and the reaction mixture is then left stirring for 30 min at a temperature of −78° C. The mixture is then allowed to return to room temperature over about 1 h. Saturated aqueous KCl solution (100 ml) is then added. The mixture is then in two phases and homogeneous. The isopropyl ether is distilled off. The KB($C_6F_5$)$_4$ precipitates at the end of the distillation. It is recovered by filtration and is then washed with saturated KCl solution (100 ml) before being dried under vacuum at a temperature of 35° C.

A product assaying at 97% of expected product is thus obtained, in a yield of 99%.

The accelerator according to the invention which is used is n-butyl lactate of formula:

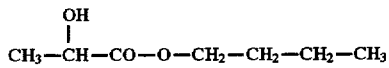

The photoinitiator system is prepared by dissolving the onium borate (optionally supplemented with some of the epoxidized PDMS to be used), on the one hand in isopropyl alcohol (IPA) for the comparative example, and, on the other hand, in the accelerator based on n-butyl lactate for the examples. The concentrations of photoinitiator in the solution vary according to the examples.

II. The general procedure followed is as follows:

to 100 parts by weight of epoxidized PDMS is added the solution of onium borate in isopropyl alcohol or in n-butyl lactate, and the mixture is stirred manually for 30 min.

III Tests:

III.1 Reactivity tests

The reactivity tests described in the following examples were carried out on a VNC (Vibrating Needle Curemeter) machine for measuring the freezing point, marketed by the company RAPRA Ltd, to which was added a UV irradiation device. During the crosslinking, the needle of the VNC immersed in the mixture to be studied encounters a resistance which manifests itself by a decrease in the output voltage of the machine. The time required to decrease the output voltage of the machine by 10, 50 and 90%, for a thickness to be polymerized of 2 mm, is measured.

III.2 Evaluation of the delamination forces by peeling tests:

This evaluation is made, after formulation of the silicone coating, according to the following steps:

coating of the mixture on a PET 6028 polyester film (marketed by Rhône-Poulenc) using a Meyer bar. The thickness deposited may range from 1 to 4 µm (deposition rate ranging from 0.5 to 3 g/m$^2$).

crosslinking of the coating under UV at a wavelength of 360 nanometer with an irradiation power of 120 W/cm, bonding of three representative types of adhesive onto the crosslinked coating:

| adhesives | TESA ® 4154 (rubber) |
| | TESA ® 4651 (rubber) |
| | TESA ® 4970 (acrylic) | placing under a press (70 g/m$^2$) for 20 to 24 hours:

under cold conditions (22°–23° C.) for the adhesives 4154 and 4970, according to FINAT test No. 10 under hot conditions (70° C.) for the adhesive 4651, according to FINAT test No. 11.

The level of adhesion may then be evaluated by measuring the delamination or peeling force. This force is measured by a dynamometer delaminating the adhesives at a speed of 300 m/min. The result is given in g/cm.

IV. Results

IV.1 Comparative Example and Example 1: Effect on the reactivity and VNC evaluation:

To 100 parts by weight of epoxidized silicone polymer in which a=7 and b=70 (or POS A), are added 2.5 parts by weight of a solution containing 20% by weight of onium borate (initiator: 0.5 parts by weight) in isopropyl alcohol (comparative example) and in n-butyl lactate (Example 1; accelerator: 2 parts by weight). The photoinitiator concentration in the solution is expressed as a percentage by weight of this compound relative to the initiator+accelerator combination.

The results are given by the curves of the attached FIG. 1. These curves represent the change in output pressure of the VNC in mV as a function of time. Table I below gives the times in minutes necessary to reach a voltage decrease of 10, 50 and 90%, for a polymerization thickness of 2 mm.

TABLE I

| VOLTAGE DECREASE | 10% | 50% | 90% | ACCELERATOR SOLVENT |
|---|---|---|---|---|
| COMPARATIVE EX. | 0.58 | 0.6 | 0.62 | Isopropyl alcohol |
| EX.1 | 0.22 | 0.25 | 0.27 | Butyl lactate |

It is seen clearly that the use of butyl lactate as accelerator makes it possible to decrease the crosslinking times significantly.

IV.2 Examples 2 to 16: evaluations of the forces to make into a thin layer:

These examples show that the antiadhesion performances, after crosslinking, are improved and that there is a most especially suitable value as regards the photoinitiator concentration of the solution of this compound in the accelerator based on n-butyl lactate.

In these examples, a mixture of epoxidized silicone polymers is used consisting of:

100 parts by weight of epoxidized silicone polymer, referred to as POS A, used in Example 1, and 5 parts by weight of epoxidized silicone polymer, referred to as POS B, in which a=2 and b=250.

The photoinitiator is predissolved in the n-butyl lactate at 5 different concentrations: 5%, 10%, 20%, 30% and 40% (the percentages are given by weight and express the amount of photoinitiator relative to the photoinitiator+accelerator combination).

The definitions of the various compositions which are prepared are collated in Table 2 below:

TABLE 2

| Examples | Mixture POS A + POS B | Photo-initiator concentration (*) | Concentration of n-butyl lactate (*) | Concentration of the photoinitiator solution |
|---|---|---|---|---|
| 2 | 100 | 0.2 | 0.3 | 40% |
| 3 | 100 | 0.2 | 0.5 | 30% |
| 4 | 100 | 0.2 | 0.8 | 20% |
| 5 | 100 | 0.2 | 1.8 | 10% |
| 6 | 100 | 0.2 | 3.8 | 5% |
| 7 | 100 | 0.4 | 0.6 | 40% |
| 8 | 100 | 0.4 | 0.9 | 30% |
| 9 | 100 | 0.4 | 1.6 | 20% |
| 10 | 100 | 0.4 | 3.6 | 10% |
| 11 | 100 | 0.4 | 7.6 | 5% |
| 12 | 100 | 0.8 | 1.2 | 40% |
| 13 | 100 | 0.8 | 1.9 | 30% |
| 14 | 100 | 0.8 | 3.2 | 20% |
| 15 | 100 | 0.8 | 7.2 | 10% |
| 16 | 100 | 0.8 | 15.2 | 5% |

(*)The concentrations of photoinitiator and of n-butyl lactate are expressed in parts by weight per 100 parts by weight of mixture POS A + POS B.

These 15 different compositions were applied to a polyester film as described above, and were crosslinked with a throughput speed of 50 m/min under a 125 W/cm UV lamp of type Fusion H. The delamination forces reported in the attached FIG. 2 were obtained with a TESA 4970 acrylic adhesive. The adhesion forces were measured directly after adhesion ("initial") and after ageing ("aged") for 20 h at 70° C. under a weight which generates a contact pressure of 6.89×10³ Pa.

Figure 2:
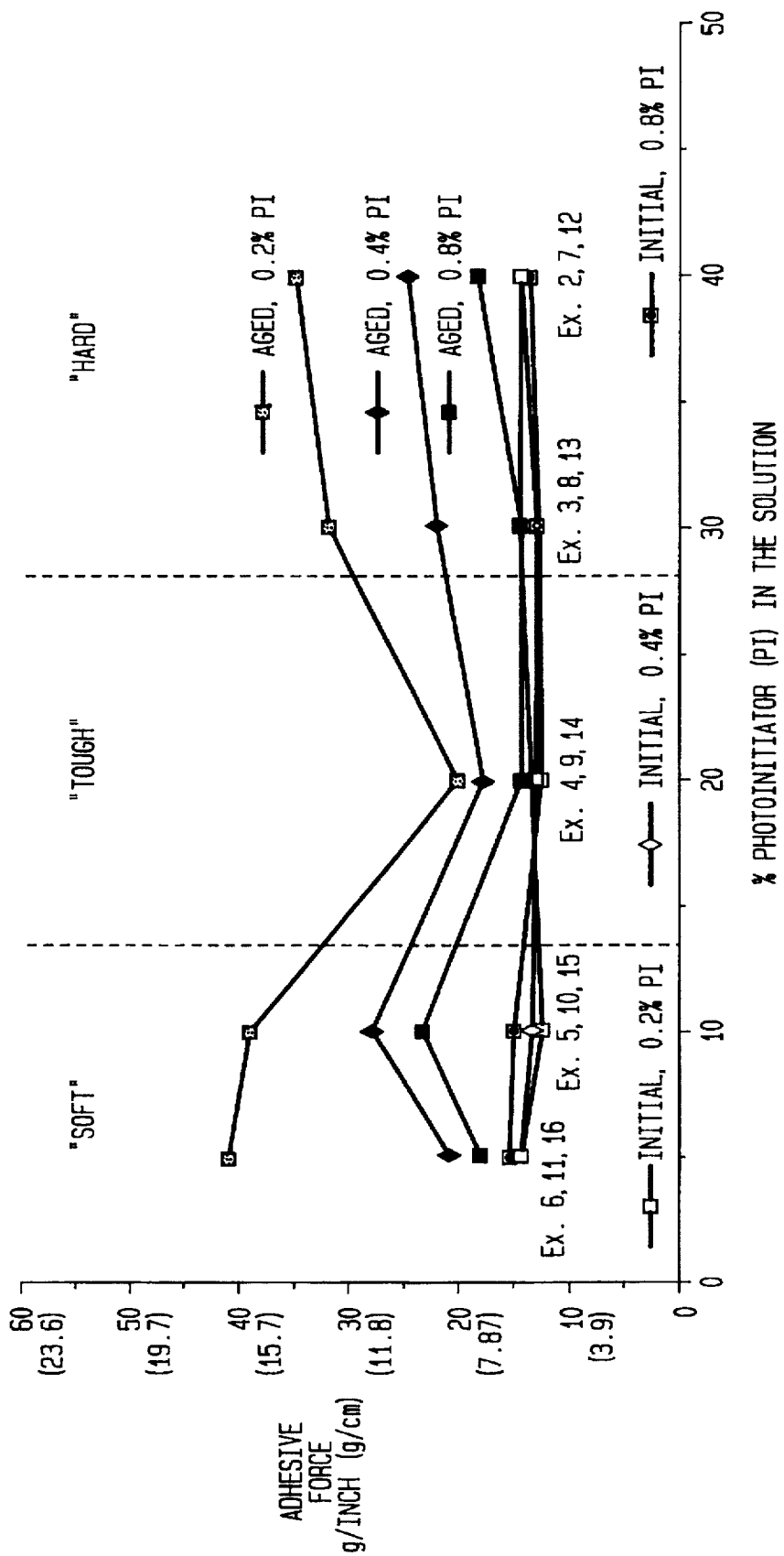

The curves featured in the attached FIG. 2 show that there is a value which is most especially suitable as regards the photoinitiator concentration in the n-butyl lactate: this value is about 20% by weight. The stability of the adhesive forces is improved for this concentration.

What is claimed is:

1. A composition useful for polymerizing or cationically crosslinking one or more monomers containing epoxide or vinyl ether organofunctional groups as a result of exposure to photochemical activation, thermal activation or electron beam radiation comprising:

(a) a catalytically effective amount of either an onium borate salt of an element selected from the group consisting of I, S, Se, P and N, or an oxoisothiochromanium salt; and (b) an accelerator comprising a compound of formula (I)

$$\underset{|}{\overset{OH}{R^1-CH-CO-O-R^2}} \quad (I)$$

wherein $R^1$ is selected from the group consisting of:

a linear or branched $C_1-C_{10}$ alkyl radical, optionally substituted with a linear or branched $C_1-C_4$ alkoxy group;

a $C_4-C_{10}$ cycloalkyl radical, optionally substituted with one or more linear or branched $C_1-C_4$ alkyl or alkoxy groups;

a $C_5-C_{12}$ aryl radical, optionally substituted with one or more linear or branched $C_1-C_4$ alkyl or alkoxy groups;

an aralkyl or aroxyalkyl radical in which the aryl part of the radical is a $C_5-C_{12}$ group optionally substituted with one or more linear or branched $C_1-C_4$ alkyl or alkoxy groups, wherein the alkyl part of the radical is a linear or branched $C_1-C_4$ group;

a linear or branched $C_1-C_{15}$ alkoxy radical; and a $C_4-C_{10}$ cycloalkyloxy radical, optionally substituted with one or more linear or branched $C_1-C_4$ alkyl or alkoxy groups; and wherein $R^2$ is selected from the group consisting of:

a linear or branched $C_1-C_{10}$ alkyl radical, optionally substituted with a linear or branched $C_1-C_4$ alkoxy group;

a $C_4-C_{10}$ cycloalkyl radical, optionally substituted with one or more linear or branched $C_1-C_4$ alkyl or alkoxy groups;

a $C_5-C_{12}$ aryl radical, optionally substituted with one or more linear or branched $C_1-C_4$ alkyl or alkoxy groups; and an aralkyl or aroxyalkyl radical in which the aryl part is a $C_5-C_{12}$ group optionally substituted with one or more linear or branched $C_1-C_4$ alkyl or alkoxy groups, wherein the alkyl part or the radical is a linear or branched $C_1-C_4$ group.

2. The composition according to claim 1, wherein $R^1$ represents a linear $C_1-C_3$ alkyl radical, and $R^2$ represents a linear or branched $C_2-C_6$ alkyl radical.

3. The composition according to claim 2, wherein $R^1$ represents a methyl radical and $R^2$ represents a linear $C_3-C_5$ alkyl radical.

4. The composition according to claim 1 wherein (a) comprises a catalytically effective amount of an onium borate salt wherein the cationic species of said salt is selected from the group consisting of:

(1) onium salts of formula (II)

$$[(R^3)_n-A-(R^4)_m]^+ \quad (II)$$

in which:

A represents an element selected from the group consisting of I, S, Se, P and N;

$R^3$ represents a $C_6-C_{20}$ carbocyclic or heterocyclic aryl radical, when $R^3$ represents a heterocyclic aryl radical, said heterocyclic radical may contain nitrogen or sulphur as hetero elements, $R^4$ represents the same moiety as $R^3$ or a linear or branched $C_1$–$C_{30}$ alkyl or alkenyl radical;

said radicals $R^3$ and $R^4$ optionally being substituted with a $C_1$–$C_{25}$ alkoxy, $C_1$–$C_{25}$ alkyl, nitro, chloro, bromo, cyano, carboxyl or mercapto group;

n is an integer ranging from 1 to (v+1), v being the valence of the element A, m is an integer ranging from 0 to (v−1) wherein n+m=v+1; or (2) an oxoisothiochromanium salt;

and wherein said anionic borate species is of formula (III):

$$[BX_aR_b]^- \quad (III)$$

in which:

a is an integer ranging from 0 to 3, and b is an integer ranging from 0 to 4, wherein a+b=4;

X represents either a halogen atom with the proviso that a is an integer from 0 to 3, or an OH function with the proviso that a is an integer from 0 to 2, R is identical or different and represents a member selected from the group consisting of:

a phenyl radical substituted with at least one electron-withdrawing group; and an aryl radical containing at least two aromatic rings optionally substituted with at least one element or an electron-withdrawing group selected from the group consisting of a halogen atom, $CF_3$, $OCF_3$, $NO_2$ or CN.

5. The composition according to claim 4, wherein the anionic borate species is selected from the group consisting of:

$[B(C_6F_5)_4]^-$, $[B(C_6H_4CF_3)_4]^-$, $[B\{C_6H_3(CF_3)_2\}_4]^-$, $[(C_6F_5)_2BF_2]^-$, $[B(C_6F_4OCF_3)_4]^-$ and $[B(C_6H_3F_2)_4]^-$.

6. The composition according to claim 4, wherein the cationic species of said salt is selected from the group consisting of:

$[(\Phi)_2I]^+$, $[C_8H_{17}-O-\Phi-I-\Phi]^+$, $[(\Phi-CH_3)_2I]^+$, $[C_{12}H_{25}-\Phi-I-\Phi]^+$, $[(C_8H_{17}-O-\Phi)_2I]^+$, $[(\Phi)_3S]^+$, $[(\Phi)_2-S-\Phi-O-C_8H_{17}]^+$, $[\Phi-S-\Phi-S-(\Phi)_2]^+$ and $[(C_{12}H_{25}-\Phi)_2I]^+$ wherein $\phi$ represents a phenyl group.

7. The composition according to claim 4, wherein said onium borate is selected from the group consisting of:

$[(\phi-CH_3)_2I]^+ [B(C_6F_5)_4]^-$; $[(\phi)_2I]^+[B(C_6F_5)_4]^-$;

$[\phi_2I]^+[B\{C_6H_3(CF_3)_2\}_4]^-$; $[C_{12}H_{25}-\phi-I-\phi]^+[B(C_6F_5)_4]^-$;

$[(C_8H_{17}-O-\phi)_2I]^+[B(C_6F_5)_4]^-$;

$[(C_8H_{17})-O-\phi-I-\phi]^+[B(C_6H_5)_4]^-$; $[(\phi)_3S]^+[B(C_6F_5)_4]^-$;

$[(\phi)_2S-\phi-O-C_8H_{17}]^+[B(C_6H_4CF_3)_4]^-$; and $[(C_{12}H_{25}-\phi)_2I]^+$ $[B(C_6F_5)_4]^-$ wherein $\phi$ represents a phenyl group.

8. A composition comprising:

(a) a catalytically effective amount of either an onium salt of an element selected from the group consisting of I, S, Se, P and N, or an oxioisothiochromanium salt;

(b) an accelerator comprising a compound of formula (I)

$$\overset{OH}{\underset{|}{R^1-CH-CO-O-R^2}} \quad (I)$$

wherein $R^1$ is selected from the group consisting of:

a linear or branched $C_1$–$C_{10}$ alkyl radical, optionally substituted with a linear or branched $C_1$–$C_4$ alkoxy group;

a $C_4$–$C_{10}$ cycloalkyl radical, optionally substituted with one or more linear or branched $C_1$–$C_4$ alkyl or alkoxy groups;

a $C_5$–$C_{12}$ aryl radical, optionally substituted with one or more linear or branched $C_1$–$C_4$ alkyl or alkoxy groups;

an aralkyl or aroxyalkyl radical in which the aryl part of the radical is a $C_5$–$C_{12}$ group optionally substituted with one or more linear or branched $C_1$–$C_4$ alkyl or alkoxy groups, wherein the alkyl part of the radical is a linear or branched $C_1$–$C_4$ group;

a linear or branched $C_1$–$C_{15}$ alkoxy radical; and a $C_4$–$C_{10}$ cycloalkyloxy radical, optionally substituted with one or more linear or branched $C_1$–$C_4$ alkyl or alkoxy groups; and wherein $R^2$ is selected from the group consisting of:

a linear or branched $C_1$–$C_{10}$ alkyl radical, optionally substituted with a linear or branched $C_1$–$C_4$ alkoxy group;

a $C_4$–$C_{10}$ cycloalkyl radical, optionally substituted with one or more linear or branched $C_1$–$C_4$ alkyl or alkoxy groups;

a $C_5$–$C_{12}$ aryl radical, optionally substituted with one or more linear or branched $C_1$–$C_4$ alkyl or alkoxy groups; and an aralkyl or aroxyalkyl radical in which the aryl part is a $C_5$–$C_{12}$ group optionally substituted with one or more linear or branched $C_1$–$C_4$ alkyl or alkoxy groups, wherein the alkyl part or the radical is a linear or branched $C_1$–$C_4$ group; and (c) at least one cationically crosslinkable polyorganosiloxane containing epoxide or vinyl ether functional groups.

9. The composition according to claim 8, wherein the polyorganosiloxane is selected from the group consisting of:

either linear or substantially linear compounds consisting of units of formula (IV), ending with units of formula (V);

or cyclic and consisting of units of formula (IV):

$$\underset{Y}{\overset{R^6}{\underset{|}{+Si-O+}}} \quad (IV) \qquad Y-\underset{R^6}{\overset{R^6}{\underset{|}{Si-O-}}} \quad (V)$$

in which formalae:

the symbols $R^6$ are identical or different and represent:

either a linear or branched $C_1$–$C_6$ alkyl radical, optionally substituted with one or more halogens;

an optionally substituted $C_5$–$C_8$ cycloalkyl radical; or a $C_5$–$C_{12}$ aryl radical or aralkyl radical having a $C_5$–$C_{12}$ aryl part and a $C_1$–$C_4$ alkyl part, optionally substituted on the aryl part with halogens, $C_1$–$C_3$ alkyl or alkoxy groups;

Y is identical or different and represents:

either the radical $R^6$; or a cationically crosslinkable organofunctional group connected to the silicon by a divalent radical containing from 2 to 20 carbon atoms optionally containing a hetero atom;

wherein at least one of the symbols Y is a cationically crosslinkable epoxide or vinyl ether organofunctional group.

10. The compositions according to claim 9, wherein the polyorganosiloxane contains from 1 to 10 organofunctional groups per mole.

11. The composition according to claim 9 wherein the polyorganosiloxane has a structure in which:

at least 60 mole % of the radicals $R^6$ are methyl radicals.

12. The compositions according to claim 9 wherein said polyorganosiloxane is linear and has a viscosity at 25° C. of about 10 to 10,000 mPa s.

13. A process for rendering articles non-adhesive to surfaces to which they would normally adhere, comprising the steps of:

(a) applying a composition comprising:
(1) a catalytically effective amount of either an onium salt of an element selected from the group consisting of I, S, Se, P and N, or an oxoisothiochromanium salt;
(2) an accelerator comprising a compound of formula (I)

$$R^1-CH-CO-O-R^2 \quad \text{(I)}$$
with OH on the CH wherein $R^1$ is selected from the group consisting of:
a linear or branched $C_1-C_{10}$ alkyl radical, optionally substituted with a linear or branched $C_1-C_4$ alkoxy group;
a $C_4-C_{10}$ cycloalkyl radical, optionally substituted with one or more linear or branched $C_1-C_4$ alkyl or alkoxy groups;
a $C_5-C_{12}$ aryl radical, optionally substituted with one or more linear or branched $C_1-C_4$ alkyl or alkoxy groups;
an aralkyl or aroxyalkyl radical in which the aryl part is a $C_5-C_{12}$ group optionally substituted with one or more linear or branched $C_1-C_4$ alkyl or alkoxy groups, wherein the alkyl part or the radical is a linear or branched $C_1-C_4$ group;
a linear or branched $C_1-C_{15}$ alkoxy radical; and
a $C_4-C_{10}$ cycloalkyloxy radical, optionally substituted with one or more linear or branched $C_1-C_4$ alkyl or alkoxy groups; and wherein $R^2$ is selected from the group consisting of:
a linear or branched $C_1-C_{10}$ alkyl radical, optionally substituted with a linear or branched $C_1-C_4$ alkoxy group;
a $C_4-C_{10}$ cycloalkyl radical, optionally substituted with one or more linear or branched $C_1-C_4$ alkyl or alkoxy groups;
a $C_5-C_{12}$ aryl radical, optionally substituted with one or more linear or branched $C_1-C_4$ alkyl or alkoxy groups; and
an aralkyl or aroxyalkyl radical in which the aryl part is a $C_5-C_{12}$ group optionally substituted with one or more linear or branched $C_1-C_4$ alkyl or alkoxy groups, wherein the alkyl part or the radical is a linear or branched $C_1-C_4$ group; and (3) at least one cationically crosslinkable polyorganosiloxane having epoxide or vinyl ether functional groups;

in an amount of between 0.1 and 500 g per $m^2$ of a surface of the said article to be coated; and (b) exposing said surface to photochemical activation, thermal activation or electron beam radiation to cure said polyorganosiloxane onto said surface.

14. The process according to claim 13, wherein step (b) comprises exposing said surface to ultraviolet radiation at a of wavelength of about 200 to 400 nanometers.

15. The process according to claim 14 wherein step (b) further comprises exposing said surface to thermal activation.

16. An article of manufacture having coated and cured on one or more of its surfaces a film of a composition comprising:

(1) a catalytically effective amount of either an onium salt of an element selected from the group consisting of I, S, Se, P and N, or an oxoisothiochromanium salt; and
(2) an accelerator comprising a compound of formula (I)

$$R^1-CH-CO-O-R^2 \quad \text{(I)}$$
with OH on the CH wherein $R^1$ is selected from the group consisting of:
a linear or branched $C_1-C_{10}$ alkyl radical, optionally substituted with a linear or branched $C_1-C_4$ alkoxy group;
a $C_4-C_{10}$ cycloalkyl radical, optionally substituted with one or more linear or branched $C_1-C_4$ alkyl or alkoxy groups;
a $C_5-C_{12}$ aryl radical, optionally substituted with one or more linear or branched $C_1-C_4$ alkyl or alkoxy groups;
an aralkyl or aroxyalkyl radical in which the aryl part is a $C_5-C_{12}$ group optionally substituted with one or more linear or branched $C_1-C_4$ alkyl or alkoxy groups,
wherein the alkyl part or the radical is a linear or branched $C_1-C_4$ group;
a linear or branched $C_1-C_{15}$ alkoxy radical; and
a $C_4-C_{10}$ cycloalkyloxy radical, optionally substituted with one or more linear or branched $C_1-C_4$ alkyl or alkoxy groups; and wherein $R^2$ is selected from the group consisting of:
a linear or branched $C_1-C_{10}$ alkyl radical, optionally substituted with a linear or branched $C_1-C_4$ alkoxy group;
a $C_4-C_{10}$ cycloalkyl radical, optionally substituted with one or more linear or branched $C_1-C_4$ alkyl or alkoxy groups;
a $C_5-C_{12}$ aryl radical, optionally substituted with one or more linear or branched $C_1-C_4$ alkyl or alkoxy groups; and
an aralkyl or aroxyalkyl radical in which the aryl part is a $C_5-C_{12}$ group optionally substituted with one or more linear or branched $C_1-C_4$ alkyl or alkoxy groups, wherein the alkyl part or the radical is a linear or branched $C_1-C_4$ group; and (3) at least one cationically crosslinkable polyorganosiloxane containing epoxide or vinyl ether functional groups.

* * * * *